(12) United States Patent
Yamaguchi

(10) Patent No.: US 7,193,297 B2
(45) Date of Patent: Mar. 20, 2007

(54) SEMICONDUCTOR DEVICE, METHOD FOR MANUFACTURING THE SAME, CIRCUIT SUBSTRATE AND ELECTRONIC DEVICE

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 112 days.

(21) Appl. No.: 10/844,419

(22) Filed: May 13, 2004

(65) Prior Publication Data

US 2005/0001327 A1    Jan. 6, 2005

(30) Foreign Application Priority Data

May 19, 2003    (JP)    ............................. 2003-140579

(51) Int. Cl.
*H01L 29/40* (2006.01)
(52) U.S. Cl. ...................... 257/621; 257/774; 257/777; 257/E23.011; 438/667
(58) Field of Classification Search ................. 257/621
See application file for complete search history.

(56) References Cited

U.S. PATENT DOCUMENTS

| | | | |
|---|---|---|---|
| 5,767,001 A | 6/1998 | Bertagnolli et al. | |
| 2002/0190375 A1* | 12/2002 | Mashino et al. | ............ 257/734 |
| 2003/0129814 A1* | 7/2003 | Mizukoshi | .................. 438/584 |

FOREIGN PATENT DOCUMENTS

| | | |
|---|---|---|
| JP | A 60-098654 | 6/1985 |
| JP | A 08-510360 | 10/1996 |
| JP | 2000-311982 | 11/2000 |
| JP | 2001-44197 | 2/2001 |
| JP | A 2001-53218 | 2/2001 |
| JP | A-2001-135780 | 5/2001 |
| JP | A-2003-282819 | 10/2003 |

* cited by examiner

*Primary Examiner*—Tu-Tu Ho
(74) *Attorney, Agent, or Firm*—Oliff & Berridge, PLC

(57) ABSTRACT

The invention provides highly reliable semiconductor devices, methods for manufacturing the same, circuit substrates and electronic devices. A semiconductor substrate is provided that includes: an integrated circuit and a pad defining a through hole electrically connected to the integrated circuit. A convex section is formed at a first surface where the pad is formed in a region that overlaps the through hole in the semiconductor substrate. A dielectric layer is formed on an inner surface of the convex section. An electrical connection section is provided having a conductive section disposed inside the dielectric layer and a wiring section disposed on the first surface to be electrically connected to the conductive section. An end surface of the conductive section is exposed through a second surface of the semiconductor substrate on the opposite side of the first surface.

21 Claims, 4 Drawing Sheets

SEMICONDUCTOR DEVICE, METHOD FOR MANUFACTURING THE SAME, CIRCUIT SUBSTRATE AND ELECTRONIC DEVICE

BACKGROUND OF THE INVENTION

1. Field of Invention

The present invention relates to semiconductor devices and methods for manufacturing the same, circuit substrates and electronic devices.

2. Description of Related Art

The related art includes semiconductor devices provided in a three-dimensional mounting configuration. Electrodes can be formed in semiconductor substrates to enable the three-dimensional mounting. In order to stack a plurality of semiconductor substrates in layers, electrodes on each of the semiconductor substrates are preferably formed into shapes that are suitable for electrical connections. Japanese Laid-Open Patent Application 2001-135780 discloses a related art method and apparatus.

SUMMARY OF THE INVENTION

The present invention provides semiconductor devices that have enhanced mountability, methods for manufacturing the same, circuit substrates and electronic devices.

A method for manufacturing a semiconductor device in accordance with the present invention includes:
  (a) preparing a semiconductor substrate including an integrated circuit, and a pad defining a through hole electrically connected to the integrated circuit;
  (b) forming a convex section at a first surface where the pad is formed in a region that overlaps the through hole in the semiconductor substrate;
  (c) forming a dielectric layer on an inner surface of the convex section;
  (d) forming an electrical connection section having a conductive section disposed inside the dielectric layer and a wiring section disposed on the first surface to be electrically connected to the conductive section; and
  (e) exposing an end surface of the conductive section through a second surface of the semiconductor substrate on the opposite side of the first surface.

According to the present invention, the electrical connection section includes a conductive section and a wiring section. The conductive section is formed within a pad region, such that a space to independently form the convex sections do not have to be secured, and therefore the conductive sections can be formed with a reduced or minimized space. Also, since the electrical connection section includes the wiring section that is electrically connected to the conductive section, electrical connections can be made in places that are different from the positions of the pads, even when each conductive section is formed within the pad region. Accordingly, by stacking semiconductor devices having mutually different pad arrangements, a semiconductor device that has enhanced mountability and yet allows electrical connections can be manufactured.

In the method for manufacturing a semiconductor device, in step (d), the conductive section and the wiring section may be formed collectively. Accordingly, the efficiency in manufacturing a semiconductor device can be enhanced.

In the method for manufacturing a semiconductor device, in step (d), the conductive section and the wiring section may be formed in one piece. Accordingly, a highly reliable semiconductor device can be manufactured.

In the method for manufacturing a semiconductor device, in step (d), the electrical connection section may be formed to have a convex section above the through hole.

In the method for manufacturing a semiconductor device, in step (d), the electrical connection section may be formed such that the wiring section has a land. Accordingly, a semiconductor device that is highly reliable in its electrical connection can be manufactured.

In the method for manufacturing a semiconductor device, in step (d), the electrical connection section may be formed such that a surface of the land is flat. Accordingly, a semiconductor device that is highly reliable in its electrical connection can be manufactured.

In the method for manufacturing a semiconductor device, in step (d), the electrical connection section may be formed such that an external configuration of the land is larger than the tip surface of the conductive section. Accordingly, a semiconductor device that is highly reliable in its electrical connection can be manufactured.

In the method for manufacturing a semiconductor device, step (d) may include:
  ($d_1$) forming a patterned resist on the first surface; and
  ($d_2$) forming the electrical connection section in a portion that is exposed through the resist.

In the method for manufacturing a semiconductor device, in step (e), a tip section of the conductive section may be made to protrude from the second surface. Accordingly, a semiconductor device that is difficult to have short circuit when stacked in layers and is highly reliable in its electrical connection can be manufactured.

In the method for manufacturing a semiconductor device, in step (e), the semiconductor substrate may be a semiconductor wafer having a plurality of integrated circuits formed thereon, and the convex section may be formed for each of the integrated circuits, and the method may further include: cutting the semiconductor substrate after step (e).

Accordingly, a plurality of semiconductor devices can be collectively manufactured, such that the efficiency in manufacturing semiconductor devices can be improved.

A method for manufacturing a semiconductor device includes: stacking and electrically connecting, through the electrical connection sections, a plurality of semiconductor devices that are manufactured by the method described above. In accordance with the present invention, semiconductor devices that have enhanced mountability are stacked in layers, such that a semiconductor device with a high electrical reliability can be manufactured.

A semiconductor device in accordance with the present invention is manufactured by the method described above.

A semiconductor device in accordance with the present invention includes:
  a semiconductor substrate including:
    an integrated circuit, and a pad defining a first through hole electrically connected to the integrated circuit;
    a second through hole that penetrates the semiconductor substrate and is formed in a region that overlaps the first through hole in the semiconductor substrate;
    a dielectric layer formed on an inner surface of the second through hole; and
  an electrical connection section including:
    a conductive section that passes inside the dielectric layer and penetrates the semiconductor substrate, and a wiring section that is electrically connected to the conductive section and disposed on a surface of the semiconductor substrate where the pad is formed.

The present invention can therefore provide a semiconductor device that includes an electrical connection section that allows semiconductor substrates having mutually different pad arrangements to be stacked in layers and electrically connected in a reduced or minimized space, and therefore has enhanced mountability.

In the semiconductor device, the conductive section and the wiring section may be formed in one piece. Accordingly, a highly reliable semiconductor device can be provided.

In the semiconductor device, a convex section may be formed in the electrical connection section above the first through hole.

In the semiconductor device, the wiring section may include a land. Accordingly, a semiconductor device that is highly reliable in its electrical connection can be provided.

In the semiconductor device, a surface of the land may be a flat surface. Accordingly, a semiconductor device that is highly reliable in its electrical connection can be provided.

In the semiconductor device, an external configuration of the land may be larger than a tip surface of the conductive section. Accordingly, a semiconductor device that is highly reliable in its electrical connection can be provided.

In the semiconductor device, a tip section of the conductive section may protrude from a surface of the semiconductor substrate on the opposite side of a surface thereof where the pad is formed. Accordingly, a highly reliable semiconductor device that is difficult to have short circuit when stacked in layers can be provided.

A semiconductor device in accordance with the present invention may include a plurality of stacked semiconductor devices described above. The plurality of semiconductor devices can be stacked in layers and electrically connected through the electrical connection sections. According to the present invention, a highly reliable semiconductor device in which semiconductor devices that are excellent in mountability are stacked in layers can be provided.

A circuit substrate in accordance with the present invention has the semiconductor device described above mounted thereon.

An electronic device in accordance with the present invention has the semiconductor device described above.

DETAILED DESCRIPTION OF PREFERRED EMBODIMENTS

Figure 1:
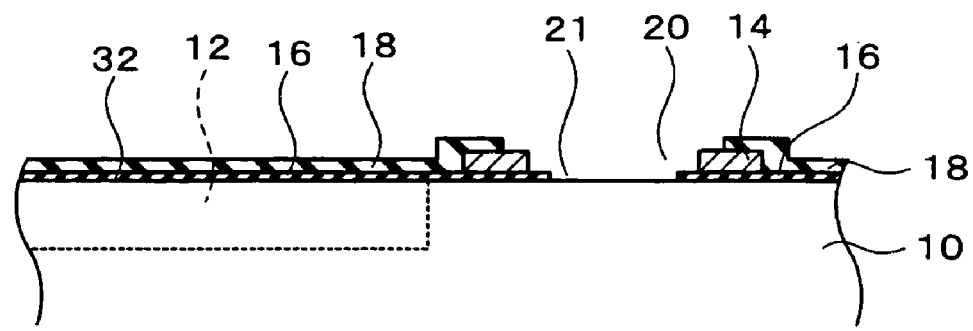
FIG. 1 is a schematic of a method for manufacturing a semiconductor device in accordance with an exemplary embodiment of the present invention.

Exemplary embodiments of the present invention are described below with reference to the accompanying drawings. However, the present invention is not limited to the exemplary embodiments described below.

FIG. 1 through FIG. 6 are schematics describing a method for manufacturing a semiconductor device in accordance with an exemplary embodiment of the present invention. First, a semiconductor substrate 10 (see FIG. 1) is prepared. The semiconductor substrate 10 may be prepared in the state of a semiconductor chip, or may be prepared in the state of a semiconductor wafer. At least one (one on a semiconductor chip, a plurality on a semiconductor wafer) integrated circuit (for example, a circuit having transistors and memories) 12 is formed on the semiconductor substrate 10.

A plurality of pads 14 are formed on the semiconductor substrate 10. Each of the pads 14 is electrically connected to the integrated circuit 12. The pad 14 may be referred to as an electrode pad. The pad 14 may be formed from aluminum. The plan configuration of the pad 14 is not particularly limited, but may generally be rectangular. When the semiconductor substrate 10 is defined in a semiconductor wafer, two or more (each one group) pads 14 are formed in each region that becomes each of plural semiconductor chips.

One layer or more layers of dielectric films may be formed on the semiconductor substrate 10. In the example shown in FIG. 1, dielectric films 16 and 18 are formed on the semiconductor substrate 10. The pad 14 and a wiring (not shown) for electrically connecting the integrated circuit 12 and the pad 14 may be formed on the dielectric film 16. Also, the other dielectric film 18 may be formed on the dielectric film 16 in a manner to avoid at least a part of the surface of the pad 14. The dielectric film 18 may be formed to cover the surface of the pad 14, and then a part thereof may be etched to expose a part of the pad 14. Either dry etching or wet etching may be used for the etching. The dielectric film 16 may be formed from an oxide film. Also, the dielectric film 18 may be referred to as a passivation film, and may be formed from SiN, $SiO_2$, polyamide resin, or the like.

A through hole 20 is formed in the pad 14. The through hole 20 may be formed in a region of the pad 14, which is exposed through the dielectric film 18. The through hole 20 may be formed by, for example, etching (dry etching or wet etching). The etching may be conducted after a resist (not shown) that is patterned by a lithography process is formed. Alternatively, a laser beam (for example, $CO_2$ laser, YAG laser, or the like) may be used to form the through hole 20. However, the semiconductor substrate 10 may be formed by using pads 14 having through holes 20 formed in advance. When the dielectric film 16 is formed below the pad 14, a through hole 21 is also formed therein (see FIG. 1). The through hole 21 may be formed in the same step that forms the through hole 20.

Figure 2:
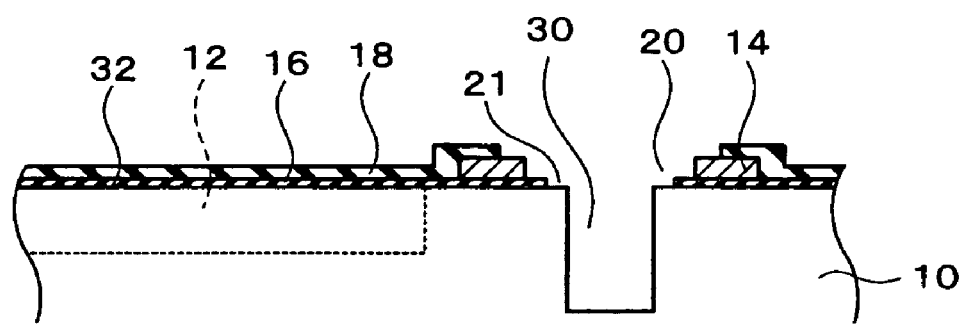
FIG. 2 is a schematic of the method for manufacturing a semiconductor device in accordance with the exemplary embodiment of the present invention.

Next, as indicated in FIG. 2, a convex section 30 is formed in the semiconductor substrate 10. The convex section 30 is formed in a region that overlaps the through hole 20 in the semiconductor substrate 10. In other words, the convex section 30 is formed in a portion of the semiconductor substrate 10 which is exposed through the through hole 20. Also, the convex section 30 is formed in a surface (first surface 32) of the semiconductor substrate 10 on which the pad 14 is formed. In order to form the convex section 30, a process similar to the process of forming the through hole 20 in the pad 14 may be used. Also, the through holes 20 and 21 and the convex section 30 may be successively formed. The through holes 20 and 21 and the convex section 30 in combination may be defined as a convex section. By the method for manufacturing the semiconductor device in accordance with the present exemplary embodiment, the convex section 30 is formed in a region of the pad 14. Accordingly, since there is no need to independently secure another space to form the convex section on the semiconductor substrate 10, the convex section 30 can be formed with a reduced or minimized space, and a semiconductor device that is high in the degree of freedom in routing a wiring section 54 to be described below and that has enhanced mountability can be manufactured.

Figure 3:
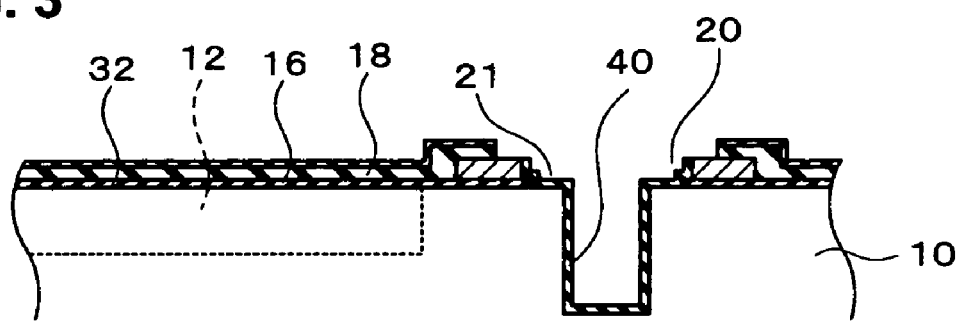
FIG. 3 is a schematic of the method for manufacturing a semiconductor device in accordance with the exemplary embodiment of the present invention.
Figure 4:
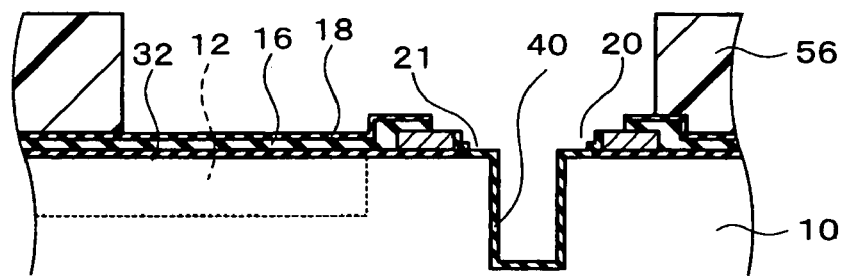
FIG. 4(A) and FIG. 4(B) are schematics of the method for manufacturing a semiconductor device in accordance with the exemplary embodiment of the present invention.
Figure 4:
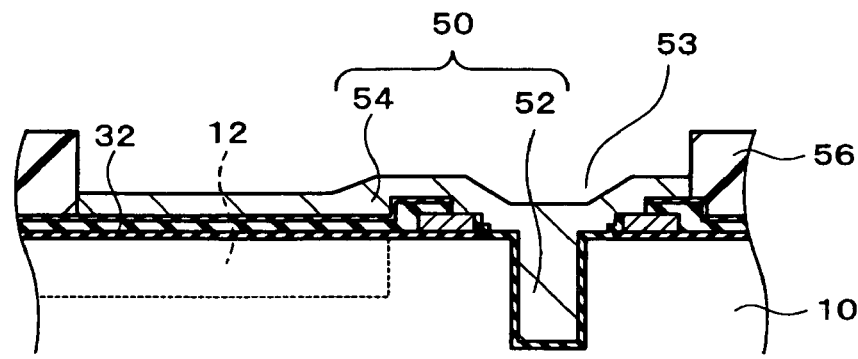

Next, as indicated in FIG. 3, a dielectric layer 40 is formed on an inner surface of the convex section 30. The dielectric layer 40 may be an oxide film. For example, when base material of the semiconductor substrate 10 is Si, the dielectric layer 40 may be $SiO_2$ or SiN. The dielectric layer 40 is formed on an inner wall surface of the convex section 30. The dielectric layer 40 may be formed on an inner wall surface of the through hole 21 in the dielectric film 16. The dielectric layer 40 may be formed on the dielectric film (passivation film) 18. The dielectric layer 40 may be formed on an inner wall surface of the through hole 20 of the pad 14. The dielectric layer 40 is formed in a manner to avoid a part of the pad 14 (for example, its upper surface). By this, the pad 14 can be electrically connected to an electrical connection section 50 to be described below. The dielectric layer 40 may be formed to cover the entire surface of the pad 14, and a part thereof may be etched (dry etched or wet etched) to expose a part of the pad 14. The etching may be conducted after forming a resist (not shown) that is patterned by a lithography process.

Next, an electrical connection section 50 is formed on the semiconductor substrate 10. The electrical connection section 50 may be formed by, for example, forming a patterned resist 56 (see FIG. 4(A)), and forming an electrical connection section 50 in a portion that is exposed through the resist 56 (see FIG. 4(B)). More specifically, for example, a conductive film (not shown) is formed by sputtering or electroless plating over the first surface 32, and then the patterned resist 56 is formed (FIG. 4(A)). The resist 56 may be patterned by a lithography process. Thereafter, electroplating may be conducted to form the electrical connection section 50 (see FIG. 4(B)). Lastly, the electrical connection section 50 may be formed through removing a part of the conductive film and the resist 56. However, the process of forming the electrical connection section 50 is not limited to the above; and for example, any one of related art or known methods, such as, for example, an ink jet method may be used. The material of the electrical connection section 50 is not particularly limited, and may be formed from, for example, Cu.

The electrical connection section 50 is formed to have a conduction section 52 and a wiring section 54. The conductive section 52 is disposed inside the dielectric layer 40. Further, the wiring section 54 is disposed over the first surface 32 in a manner to be electrically connected to the conductive section 52. Consequently, the conductive section 52 is formed within the convex section 20 in the region of the pad 14 in the semiconductor substrate 10. As described above, due to the fact that the convex section 20 is formed in the region of the pad 14, the degree of freedom in routing the wiring section 54 can be increased. Further, because the wiring section 54 allows the electrical connection section 50 to be electrically connected at a position different from the pad 14, semiconductor substrates having mutually different pad arrangements can be stacked in layers, and electrically connected to one another. Consequently, by forming the electrical connection section 50 in the semiconductor substrate 10, a semiconductor device having enhanced mountability can be manufactured.

The conductive section 52 and the wiring section 54 may be collectively formed. By this, the efficiency in manufacturing the semiconductor device can be enhanced. Also, the conductive section 52 and the wiring section 54 may be formed in one piece. By this, a semiconductor device that is highly reliable in its electrical connection can be manufactured. Also, the electrical connection section 50 may be formed with a convex section 53 provided above the through hole 20 (see FIG. 4(B)). Electrical connection to the electrical connection section 50 can be readily made because it has the wiring section 54, even when the convex section 53 is provided above the through hole 20. However, the electrical connection section 50 may be formed in a manner that a portion thereof above the through hole 20 is flat.

Figure 6:
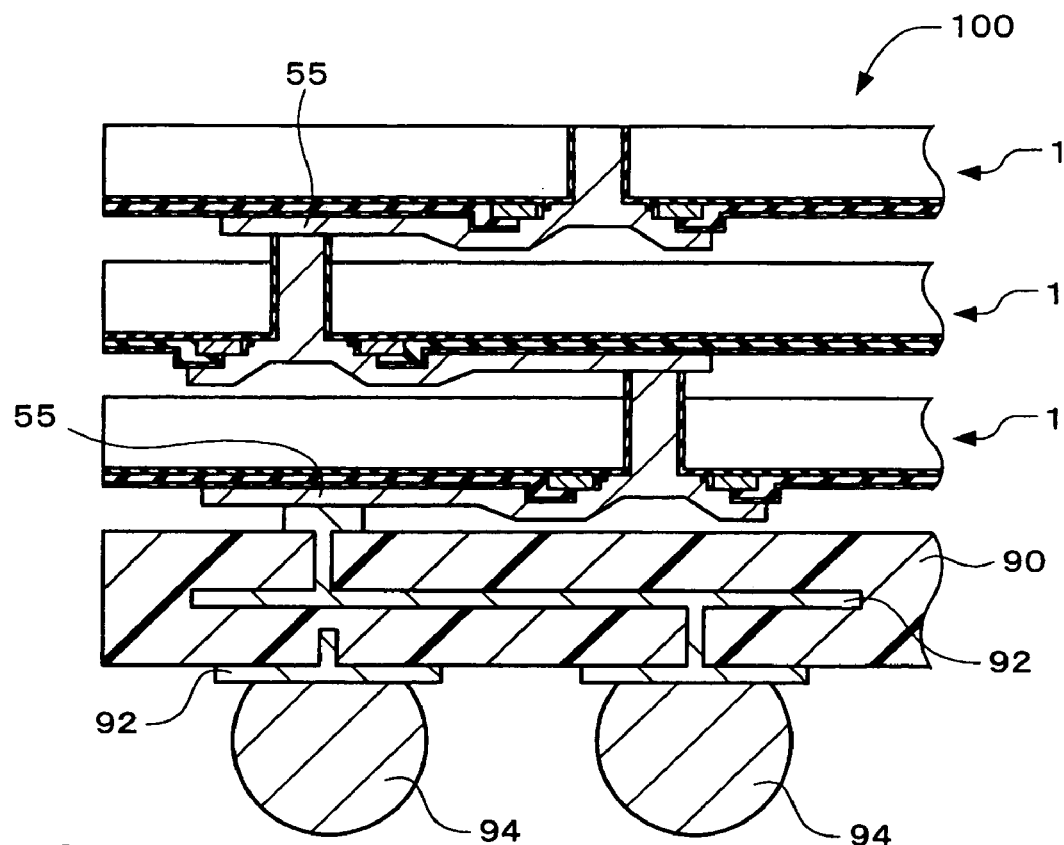
FIG. 6 is a schematic of the method for manufacturing a semiconductor device in accordance with an exemplary embodiment of the present invention.

The electrical connection section 50 may be formed such that the wiring section 54 has a land 55 (see FIG. 6). As a consequence, when a plurality of semiconductor substrates 10 are stacked in layers, mutual electrical connection among the electrical connection sections 50 can be readily made. Accordingly, a highly reliable semiconductor device can be manufactured. The electrical connection section 50 may be formed in a manner that the surface of the land 55 becomes flat. For example, the land 55 may be formed on a flat portion in the first surface 32 of the semiconductor substrate 10, and its surface may be formed to become flat. Alternatively, the electrical connection section 50 may be formed in a manner that the external configuration of the land 55 becomes larger than the tip surface of the conductive section 52. As a consequence, a semiconductor device with a greater reliability can be manufactured.

Figure 5:
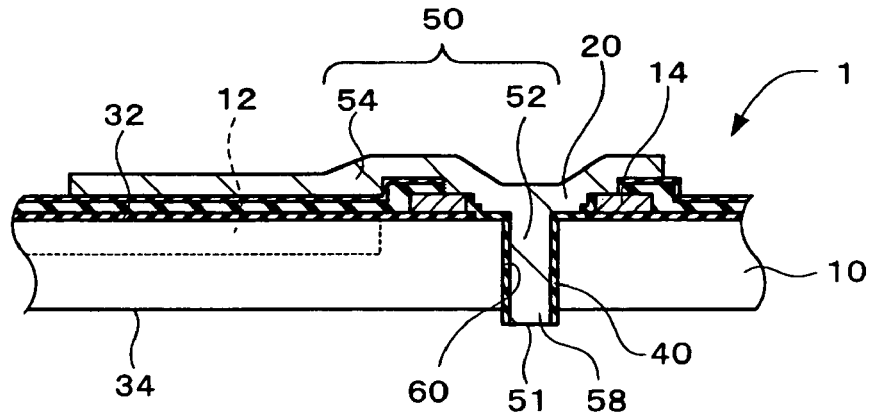
FIG. 5 is a schematic of the method for manufacturing a semiconductor device in accordance with the exemplary embodiment of the present invention.

Next, as indicated in FIG. 5, the tip surface 51 of the conductive section 52 is exposed through a second surface 34 on the opposite side of the first surface 32 of the semiconductor substrate 10. By this, the two surfaces of the semiconductor substrate 10 can be electrically connected through the electrical connection section 50. For example, the tip surface 51 can be exposed by mechanically polishing the second surface 34, or removing a part of the second surface 34 by etching. Alternatively, both mechanical polishing and etching can be used to expose the tip surface 51. In this instance, since the convex section 30 penetrates the semiconductor substrate 10, the through hole 60 is formed in the semiconductor substrate 10. Further, by removing a part of the dielectric layer 40, the tip surface 51 of the conductive section 52 may be exposed. A part of the dielectric layer 40 may be removed by etching. As indicated in FIG. 5, the tip portion 58 of the conductive section 52 may be made to protrude from the second surface 34. By this, when a plurality of semiconductor substrates 10 are stacked in layers, short circuits can be reduced or prevented, and a stacked-layered type semiconductor device with a high electrical reliability can be manufactured.

By the steps described above, the semiconductor device 1 can be manufactured (see FIG. 5). When a semiconductor wafer is used as the semiconductor substrate 10, the semiconductor device 1 may be manufactured through cutting the semiconductor wafer into individual segments in the end.

The semiconductor device 1 includes the semiconductor substrate 10. The semiconductor substrate 10 includes an integrated circuit 12, and a pad 14 having a through hole (first through hole) 20 formed therein and electrically connected to the integrated circuit 12. The semiconductor device 1 includes a through hole (second through hole) 60 that penetrates the semiconductor substrate 10. In other words, the through hole (second through hole) 60 is formed in the semiconductor substrate 10. The through hole 60 is formed in a region that overlaps the through hole (first through hole) 20 in the semiconductor substrate 10. The semiconductor device 1 includes a dielectric layer 40 that is formed on an inner surface of the through hole 60. The semiconductor device 1 includes an electrical connection section 50. The electrical connection section 50 includes a conductive section 52 that passes inside the dielectric layer 40 and penetrates the semiconductor substrate 10, and a wiring section 54 that is electrically connected to the conductive section 52 and disposed on a surface (first surface 32) of the semiconductor substrate 10 on which the pad 14 is formed. The other compositions are equal to the contents obtained through the manufacturing method described above.

As indicated in FIG. 6, a semiconductor device 100 having a stacked-layered semiconductor device 1 may be manufactured by stacking a plurality of the semiconductor devices 1 in layers, and electrically connecting them through the electrical connection sections 50. The present exemplary embodiment is effective in conducting such a three dimensional mounting, because the semiconductor device 1 includes the electrical connection section 50 having the conductive section 52 and the wiring section 54. In particular, when semiconductor substrates having mutually different pad arrangements are stacked in layers, the electrical connection sections 50 allow them to be electrically connected to one another. When the wiring section 54 includes a land 55, the tip surface 51 of the conductive section 52 of one semiconductor device 1 and the land 55 of the wiring section 54 of another semiconductor device 1 may be opposed to each other and electrically connected to each other. By this, a highly reliable semiconductor device 100 can be manufactured.

Figure 7:
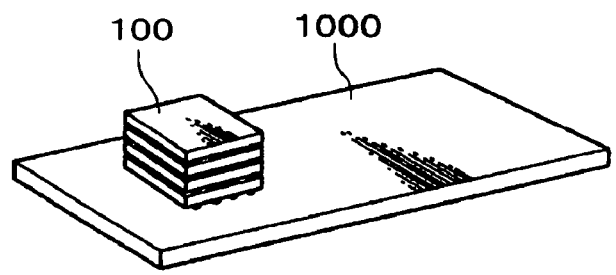
FIG. 7 is a schematic of a circuit substrate having a semiconductor device in accordance with an exemplary embodiment of the present invention mounted thereon.
Figure 8:
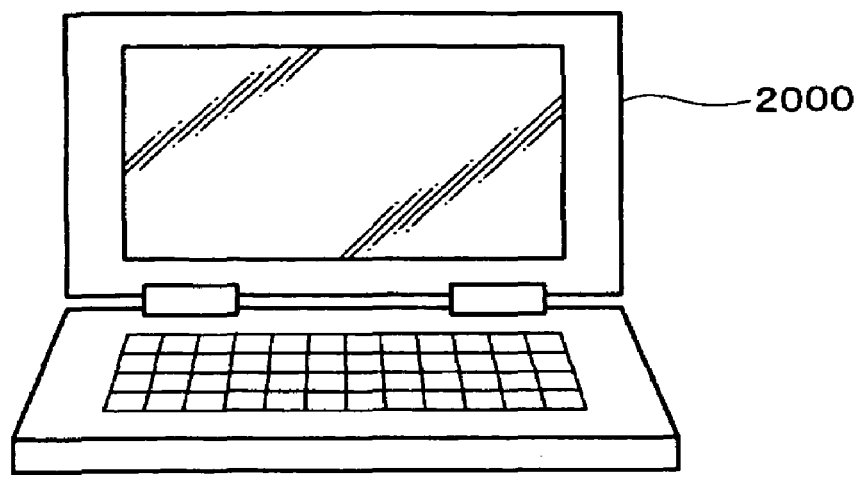
FIG. 8 is a schematic of an electronic device having a semiconductor device in accordance with an exemplary embodiment of the present invention.
Figure 9:
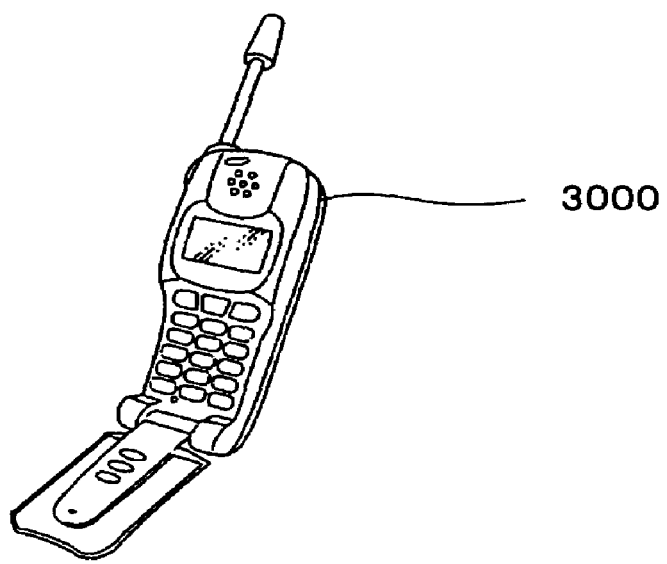
FIG. 9 is a schematic of an electronic device having a semiconductor device in accordance with an exemplary embodiment of the present invention.

The semiconductor device 100 may include a wiring substrate 90. The stacked-layered semiconductor device 1 may be mounted on the wiring substrate 90. A plurality of wirings 92 and external terminals 94 may be formed on the wiring substrate 90. As a result, a semiconductor device 100 that is easy to mount on a circuit substrate, etc., can be provided. Furthermore, dielectric layers (not shown) (that may have a stress relieving function) may be formed between the semiconductor devices 1 stacked in layers. By this, a highly reliable semiconductor device 100 can be formed. FIG. 7 shows a circuit substrate 1000 on which the semiconductor device 100 in accordance with the exemplary embodiment of the present invention is mounted. Also, as electronic devices having the semiconductor device in accordance with the exemplary embodiment of the present invention, a notebook type personal computer 2000 is shown in FIG. 8, and a portable telephone 3000 is shown in FIG. 9.

The present invention is not limited to the exemplary embodiments described above, and many modifications can be made. For example, the present invention may include compositions that are substantially the same as the compositions described in the exemplary embodiments (for example, a composition that has the same or similar functions, the same or similar methods and the results, or a composition that has the same or similar advantages and effects). Also, the present invention includes compositions in which portions not essential in the compositions described in the exemplary embodiments are replaced with others. Also, the present invention includes compositions that achieve the same or similar functions and effects or achieve the same or similar advantages as those of the compositions described in the exemplary embodiments. Furthermore, the present invention includes compositions that include related art or known technology added to the compositions described in the exemplary embodiments.

What is claimed is:

1. A method for manufacturing a semiconductor device, comprising:
    preparing a semiconductor substrate including an integrated circuit, and a pad defining a through hole electrically connected to the integrated circuit;
    forming a convex section at a first surface where the pad is disposed in a region that overlaps the through hole in the semiconductor substrate;
    forming a dielectric layer on an inner surface of the convex section;
    forming an electrical connection section having a conductive section disposed inside the dielectric layer and a wiring section disposed on the first surface to be electrically connected to the conductive section; and
    exposing an end surface of the conductive section through a second surface of the semiconductor substrate on the opposite side of the first surface,
    the forming the electrical connection section including forming a patterned resist on the first surface, the electrical connection section being formed in a portion of the surface that is exposed through the patterned resist,
    the conductive section filling in the convex section to at least the first surface.

2. The method for manufacturing a semiconductor device according to claim 1, the forming the electrical connection section including collectively forming the conductive section and the wiring section.

3. The method for manufacturing a semiconductor device according to claim 1, the forming the electrical connection section including forming the conductive section and the wiring section in one piece.

4. The method for manufacturing a semiconductor device according to claim 1, the forming the electrical connection section including forming the electrical connection section to have a convex section above the through hole.

5. The method for manufacturing a semiconductor device according to claim 1, the forming the electrical connection section including forming the electrical connection section such that the wiring section has a land.

6. The method for manufacturing a semiconductor device according to claim 5, the forming the electrical connection section including forming the electrical connection section such that a surface of the land is flat.

7. The method for manufacturing a semiconductor device according to claim 5, the forming the electrical connection section including forming the electrical connection section such that an external configuration of the land is larger than the end surface of the conductive section.

8. The method for manufacturing a semiconductor device according to claim 1, the exposing the end surface including making a tip section of the conductive section to protrude from the second surface.

9. The method for manufacturing a semiconductor device according to claim 1, the semiconductor substrate being a semiconductor wafer having a plurality of integrated circuits formed thereon, and the convex section being formed for each of the integrated circuits, the method further comprising cutting the semiconductor substrate after the exposing the end surface.

10. A method for manufacturing a semiconductor device, comprising:
stacking and electrically connecting through, the electrical connection section, a plurality of semiconductor devices manufactured by the method according to claim 1.

11. A semiconductor device manufactured by the method for manufacturing a semiconductor device according to claim 1.

12. A circuit substrate, comprising:
the semiconductor device according to claim 11.

13. An electronic device, comprising:
the semiconductor device according to claim 11.

14. A semiconductor device, comprising:
a semiconductor substrate including an integrated circuit, and a pad defining a first through hole electrically connected to the integrated circuit;
a second through hole that penetrates the semiconductor substrate, formed in a region that overlaps the first through hole in the semiconductor substrate;
a dielectric layer formed on an inner surface of the second through hole; and
an electrical connection section including: a conductive section that passes inside the dielectric layer and penetrates the semiconductor substrate, and a wiring section that is electrically connected to the conductive section and disposed on a surface of the semiconductor substrate where the pad is disposed,
the surface of the semiconductor substrate where the pad is disposed including a patterned resist, the electrical connection section being formed in a portion of the surface that is exposed through the patterned resist,
the conductive section filling in the convex section to at least the surface of the semiconductor substrate where the pad is disposed.

15. The semiconductor device according to claim 14, the conductive section and the wiring section being formed in one piece.

16. The semiconductor device according to claim 14, a convex section being formed in the electrical connection section above the first through hole.

17. The semiconductor device according to claim 14, the wiring section including a land.

18. The semiconductor device according to claim 17, a surface of the land being a flat surface.

19. The semiconductor device according to claim 17, an external configuration of the land being larger than a tip surface of the conductive section.

20. The semiconductor device according to claim 14, a tip section of the conductive section protruding from a surface of the semiconductor substrate on the opposite side of a surface where the pad is formed.

21. A semiconductor device, comprising:
a plurality of stacked semiconductor devices according to claim 14, the plurality of semiconductor devices being stacked in layers and electrically connected through the electrical connection sections.

* * * * *